(12) United States Patent
Van Der Veen

(10) Patent No.: US 9,140,999 B2
(45) Date of Patent: Sep. 22, 2015

(54) RETICLE ASSEMBLY, A LITHOGRAPHIC APPARATUS, THE USE IN A LITHOGRAPHIC PROCESS, AND A METHOD TO PROJECT TWO OR MORE IMAGE FIELDS IN A SINGLE SCANNING MOVEMENT OF A LITHOGRAPHIC PROCESS

(71) Applicant: Paul Van Der Veen, Waalre (NL)

(72) Inventor: Paul Van Der Veen, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 412 days.

(21) Appl. No.: 13/679,662

(22) Filed: Nov. 16, 2012

(65) Prior Publication Data

US 2013/0128250 A1    May 23, 2013

Related U.S. Application Data

(60) Provisional application No. 61/562,892, filed on Nov. 22, 2011.

(51) Int. Cl.
| | | |
|---|---|---|
| *G03B 27/32* | (2006.01) | |
| *G03B 27/42* | (2006.01) | |
| *G03B 27/62* | (2006.01) | |
| *G03F 7/20* | (2006.01) | |
| *H01L 21/68* | (2006.01) | |

(52) U.S. Cl.
CPC ........ *G03F 7/70633* (2013.01); *G03F 7/70425* (2013.01); *G03F 7/70716* (2013.01); *H01L 21/682* (2013.01)

(58) Field of Classification Search
CPC ............ G03F 7/70358; G03F 7/70425; G03F 7/70633; G03F 7/70716; H01L 21/68; H01L 21/682
USPC .......................................... 355/53, 67, 75, 77
See application file for complete search history.

(56) References Cited

U.S. PATENT DOCUMENTS 4,878,086 A * 10/1989 Isohata et al. .................... 355/77
4,924,258 A *  5/1990 Tsutsui ........................... 355/53

(Continued)

FOREIGN PATENT DOCUMENTS

| JP | 2000-021702 | 1/2000 |
| JP | 2005-203399 | 7/2005 |

(Continued)

*Primary Examiner* — Colin Kreutzer
(74) *Attorney, Agent, or Firm* — Pillsbury Winthrop Shaw Pittman LLP

(57) ABSTRACT

A reticle assembly for use in a lithographic process in which a first image field and a second image field are projected onto a first target portion and a second target portion on a substrate, the reticle assembly being arranged to hold a first reticle having the first image field and a second reticle having the second image field such that a distance between the first and second image fields substantially corresponds to a distance between the first and the second target portions. Embodiments also relate to a lithographic apparatus including the reticle assembly, the use in a lithographic process in which a first image field and a second image field are projected onto a first target portion and a second portion on a substrate, of a first reticle having the first image field and a second reticle having the second image field, wherein a distance between the first and second image fields substantially corresponds to a distance between the first and second target portions.

12 Claims, 5 Drawing Sheets

(56) References Cited

U.S. PATENT DOCUMENTS

| | | | |
|---|---|---|---|
| 4,998,134 A * | 3/1991 | Isohata et al. | 355/53 |
| 5,721,606 A | 2/1998 | Jain | |
| 6,078,381 A * | 6/2000 | Suzuki | 355/53 |
| 6,628,372 B2 * | 9/2003 | McCullough et al. | 355/75 |
| 7,671,968 B2 | 3/2010 | Loopstra et al. | |
| 2004/0156028 A1 * | 8/2004 | Okada | 355/53 |
| 2005/0012914 A1 | 1/2005 | Lin | |
| 2005/0105073 A1 * | 5/2005 | Stacker et al. | 355/53 |
| 2007/0002516 A1 * | 1/2007 | Matsumoto | 361/234 |
| 2007/0013885 A1 | 1/2007 | Loopstra et al. | |
| 2007/0242249 A1 * | 10/2007 | Shibazaki et al. | 355/55 |
| 2007/0242257 A1 * | 10/2007 | Wurm et al. | 355/75 |
| 2009/0046266 A1 * | 2/2009 | Nishinaga | 355/53 |
| 2009/0279066 A1 * | 11/2009 | Tinnemans et al. | 355/71 |
| 2012/0212715 A1 * | 8/2012 | Beerens et al. | 355/53 |

FOREIGN PATENT DOCUMENTS

| | | |
|---|---|---|
| JP | 2006-318954 | 11/2006 |
| JP | 2007-027732 | 2/2007 |
| JP | 2007-201457 | 8/2007 |
| JP | 2008-076650 | 4/2008 |
| JP | 2010-272673 | 12/2010 |
| KR | 10-2008-0010656 | 1/2008 |
| WO | 2004/077163 | 9/2004 |
| WO | 2009/078434 | 6/2009 |

\* cited by examiner

RETICLE ASSEMBLY, A LITHOGRAPHIC APPARATUS, THE USE IN A LITHOGRAPHIC PROCESS, AND A METHOD TO PROJECT TWO OR MORE IMAGE FIELDS IN A SINGLE SCANNING MOVEMENT OF A LITHOGRAPHIC PROCESS

CROSS REFERENCE TO RELATED APPLICATIONS

This application claims priority and benefit under 35 U.S.C. §119(e) to U.S. Provisional Patent Application Ser. No. 61/562,892, filed on Nov. 22, 2011, the content of which is incorporated herein in its entirety by reference.

FIELD

The present invention relates to a reticle assembly, a lithographic apparatus, the use in a lithographic process of a first reticle and a second reticle, and a method to project two or more image fields in a single scanning movement in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to make use of a lithographic apparatus as efficiently as possible, it is desirable to achieve a high throughput of the lithographic apparatus, so that a large amount of substrates can be processed by the lithographic apparatus in the short time.

In a scanning mode of a scanning-type lithographic apparatus, the substrate table is moved with a substrate table scanning movement, i.e. a movement with a substantially constant speed, across a projection system. At the same time as the scanning movement of the substrate table, a support supporting a patterning device is scanned also with a scanning movement, i.e. a movement with substantially constant speed across the projection system to impart a pattern in a radiation beam of the lithographic apparatus. Since, during projection, the support of the patterning device is moved from a starting position to an end position, the patterning device support has to be moved back to the start position before the patterning device support is ready for a new scanning movement in the same direction.

Therefore, the lithographic apparatus may be configured to make a meandering pattern of substrate table scanning movements over the substrate. The subsequent scanning movements of the patterning device support may then be in opposite directions, since the direction of the subsequent substrate scanning movements is also in opposite directions. For each substrate table scanning movement, the substrate table has to be decelerated and accelerated to obtain the desired speed and direction. Such deceleration and subsequent acceleration to a substantially constant speed takes considerable time.

During this time for deceleration and acceleration, the lithographic apparatus can not be used for the exposure of image fields on the substrate, which has a negative influence on the throughput of the lithographic apparatus. Since there is an increasing need to increase throughput of a lithographic apparatus, it is desirable that the exposure of target portion a substrate can be performed more efficiently.

A possible solution would be to use of larger reticles which may comprise a number of image fields to expose multiple target portions on the substrate. However, in practice, the possibilities for substantially increasing the size of reticles, while maintaining the same specifications of the reticle are limited.

SUMMARY

It is desirable to improve the efficiency of scanning movements in a lithographic apparatus.

According to an embodiment of the invention, there is provided a reticle assembly for use in a lithographic process in which a first image field and a second image field are projected onto a first target portion and a second target portion on a substrate, the reticle assembly being arranged to hold a first reticle having the first image field and a second reticle having the second image field such that a distance between the first and second image fields corresponds to a distance between the first and the second target portions.

According to an embodiment of the invention, there is provided a lithographic apparatus comprising a reticle assembly.

According to an embodiment of the invention, there is provided the use in a lithographic process in which a first image field and a second image field are projected onto a first target portion and a second portion on a substrate, of a first reticle having at the first image field and a second reticle having a the second image field, wherein a distance between the first and second image fields corresponds to a distance between the first and second target portions.

According to an embodiment of the invention, there is provided a method to project two or more image fields on a first target portion and second target portion on a substrate in a single scanning movement of a lithographic process, comprising: providing a first reticle having the first image field and a second reticle having the second image field, providing a distance between the first and second image field corresponding to a distance between the first and second target portions.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
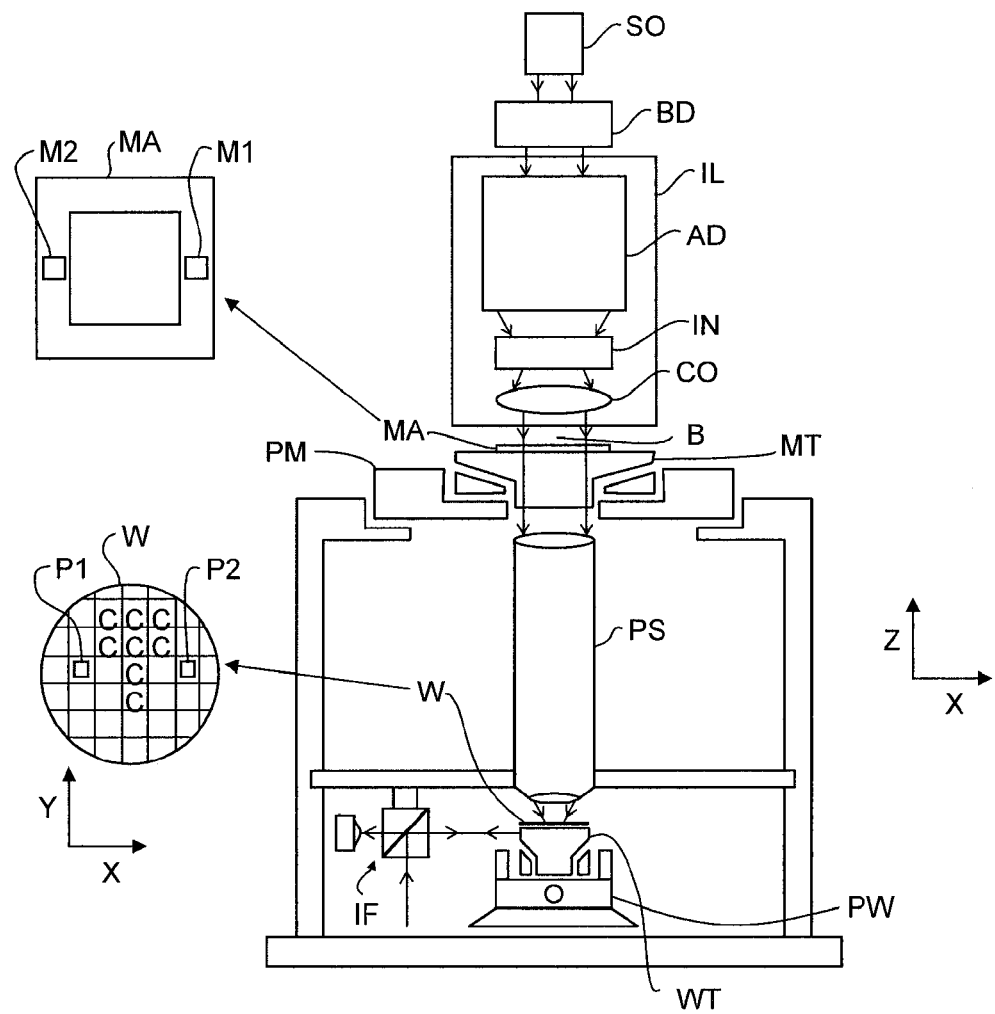
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a scanning mode of the lithographic apparatus, the substrate table WT is moved with a substrate table scanning movement, i.e. a movement with a substantially constant speed in a scanning direction (in this case y-direction), across a projection system PS. During the substrate table scanning movement of the substrate table WT, a support or support structure MT supporting a reticle MA is scanned also with a scanning movement, i.e. a movement with substantially constant speed across the projection system PS to impart a pattern in a radiation beam B of the lithographic apparatus. This scanning movement is also made in a scanning direction.

In the lithographic apparatus shown in FIG. 1 the substrate table scanning movement and the scanning movement of the reticle support are opposite, i.e. in positive and negative y-direction. In an alternative embodiment, the movements may be parallel; i.e. both in positive or negative y-direction.

During projection of this patterned radiation beam B, the support MT of the reticle MA is moved from a starting position to an end position. To make a subsequent projection of the patterned radiation beam B on the substrate W possible during the same substrate table scanning movement, the support (e.g. reticle support) MT has to be moved back to the start position before the reticle support MT is ready for a new scanning movement in the same direction.

Therefore, the lithographic apparatus may be configured to make a meandering pattern of substrate table scanning movements over the substrate W. The subsequent scanning movements of the reticle support MT may then be in opposite directions, since the direction of the subsequent substrate table scanning movements is also in opposite directions. However, for each substrate table scanning movement, the substrate table WT has to be decelerated and accelerated to obtain the desired speed and direction. Such deceleration and acceleration to a substantially constant speed takes considerable time.

Figure 2:
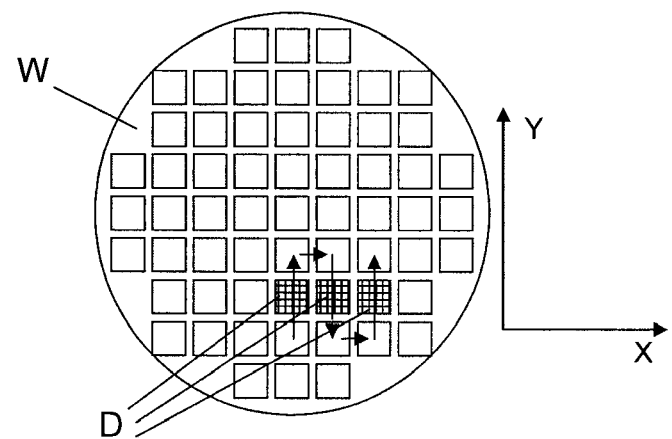
FIG. 2 depicts a prior art scanning pattern of a substrate table in a lithographic apparatus.

The meandering scanning pattern of substrate table scanning movements is shown in FIG. 2.

The substrate W is moved with a substrate table scanning movement indicated by the arrow, with respect to the projection system PS. During this substrate table scanning movement in the positive Y-direction the patterned radiation beam B is projected on a first target portion D. When exposure of the target portion D is finished, the substrate table WT is decelerated, moved in the X-direction over the distance of a row of target portions and accelerated up to the scanning speed to perform a second scanning movement in the negative Y-direction to expose the patterned radiation beam B on a second target portion D. After the exposure of the second target portion D has been finished, the substrate table WT is again decelerated, moved in the X-direction and accelerated up to the scanning speed to perform a third scanning movement in the positive Y-direction to expose the patterned radiation beam B on a third target portion D. This pattern can be repeated until a patterned radiation beam B has been exposed on all target portions of the substrate D, where exposure is desired.

During the projection of the patterned radiation beam B on the target portion D, the reticle support MT is moved with a scanning movement from a start position to an end position. The time required for deceleration, movement in the X-direction and acceleration of the substrate table WT must be used to decelerate the reticle support MT and accelerate it in the opposite direction up to the desired substantially constant scanning speed of the scanning movement.

The time required for deceleration and acceleration of the substrate table WT and the reticle support MT, cannot be used for the actual projection of patterns on the target portions D.

Figure 3:
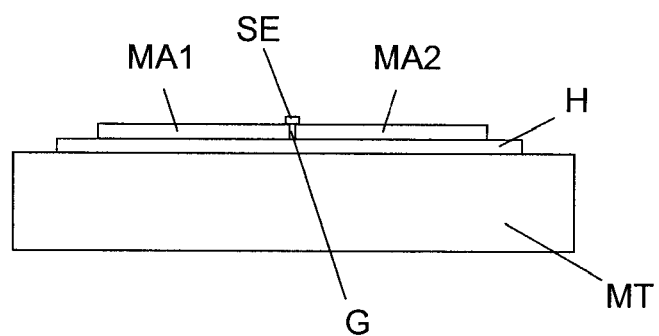
FIG. 3 depicts a side view of a reticle support and reticle assembly according to an embodiment of the invention.
Figure 4:
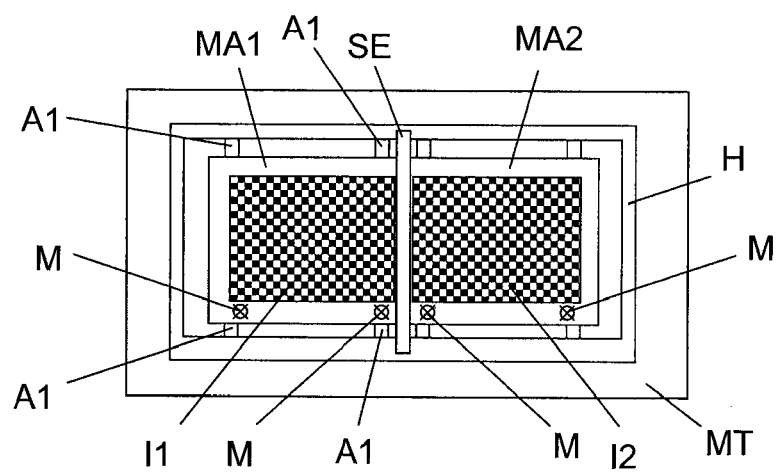
FIG. 4 depicts a top view of the reticle support and reticle assembly of FIG. 3.

FIGS. 3 and 4 show a reticle assembly comprising a reticle support MT configured to support a holder H. The holder H is configured to hold a first reticle MA1 and a second reticle MA2. The first reticle MA1 comprises a first image field I1 and the second reticle MA2 comprises a second image field I2. The first image field I1 and the second image field I2 are patterns to create the patterned projection beam B to be exposed on the target portions D. The first image field I1 and the second image field I2 may have the same pattern or different patterns.

The holder H is designed to hold the first reticle MA1 and the second reticle MA2 adjacent to each other and aligned with respect to each other.

The holder H may comprise a first set of actuators A1 to position the first reticle MA1 with respect to the holder H, and therewith with respect to the second reticle MA2. The holder H may hold the second reticle MA2 in a fixed position. In an alternative embodiment, the holder H may comprise a second set of actuators to position the second reticle MA2 with respect to the holder H. Also, it may be possible to provide a holder H configured to hold the first reticle MA1 and second reticle MA2 in aligned position. The positioning of the first reticle MA1 and second reticle MA2 may be performed by other devices, for example positioning devices in the alignment device.

The actuators of the set of actuators A1 may be of any suitable type, such as piezo, electromagnetic or electrostatic actuators. In an embodiment, the actuators are positioned and configured to position a reticle in six degrees of freedom. The holder H may comprise any device capable of holding the respective reticle in a desired position, for example clamps, such as vacuum, magnetic or electrostatic clamps.

The first reticle MA1 and the second reticle MA2 are aligned with respect to each other by an alignment process in an alignment device. The alignment device may be a separate alignment device or may be part of the lithographic apparatus.

In this application alignment of the first reticle MA1 and the second reticle MA2 with respect to each other means that the image fields of the first reticle MA1 and the second reticle MA2 are arranged substantially in the same plane and orientation as if the image fields were arranged on a single reticle surface.

The alignment device comprises one or more alignment sensors, for example TIS sensors, configured to determine the position of the first reticle MA1 and the second reticle MA2 by reading the alignment marks M provided on each of the first reticle MA1 and the second reticle MA2. When the relative position of the first reticle MA1 with respect to the second reticle MA2 is known, the set of actuators A1 can be used to adapt the position of the first reticle MA1 with respect to the second reticle MA2 so that the first reticle MA1 and the second reticle MA2 are properly aligned with respect to each other.

The alignment process may be performed when the holder H is already loaded on the reticle support MT, or before it is loaded on the reticle support MT. In the latter case the alignment may be performed in a conditioned environment, and the lithographic process may be started directly after loading the holder holding the aligned first reticle MA1 and second reticle MA2.

In an embodiment, the alignment is performed in six degrees of freedom.

The first reticle MA1 and the second reticle MA2 may be arranged adjacent to each other such that the distance between the first image field and the second image field divided by the scanning speed of the reticle support corresponds to the distance between two target portions D on the substrate divided by the scanning speed of the substrate table, i.e. the time required in a lithographic process to bridge the distance between the first image field and the second image field is the same as the time required to bridge the distance between the first target portion and a subsequent target portion, and when the reticle support and the substrate table move at their respective scanning speeds. It may be difficult to produce a reticle having the image field extending to the edge of the reticle. Often there will be a part of the reticle surrounding the image field, that does not have an image field. When the distance between the image fields of the first reticle MA1 and the second reticle MA2 substantially corresponds (i.e. it is the same or almost the same distance) to the distance between the first and second target portion, no image will be projected between the target portions. This may improve the efficiency of the lithographic apparatus.

The distance between the first image field I1 and the second image field I2 on the first reticle MA1 and the second reticle MA2, respectively, is for instance 0.25 mm when the distance between two adjacent target portion on the substrate is 1 mm, when the scanning speed of the substrate table during a scanning movement is four times the scanning speed of the reticle support.

Between the adjacent edges of the first reticle and the second reticle there may be gap G. To avoid that light passes through this gap G and undesirably reaches the substrate W, the reticle assembly may comprise a covering element SE of opaque material placed over the gap G. The covering element may be a strip element. The covering element SE may also prevent scattering problems caused by the edges of the reticles MA1, MA2. The covering element SE may cover a part of at least one of the first and second reticles MA1, MA2 between the first and second image fields I1, I2. Any other device to avoid that light passes the gap G may also be applied.

As an alternative, the reticle masking device of the lithographic apparatus (REMA) which is used to limit the projection beam to the desired projection window used for projection may also be used to block the projection beam when the gap G passes the projection window during a scanning movement. However, it is remarked that the limited time during a scanning movement to bridge the distance between the first image field I1 and the second image field I2 may not be sufficient to temporarily close the reticle masking device to block the projection beam.

In some embodiments, it may be possible to place the first reticle MA1 and the second reticle MA2 against each other so that there is substantially no gap G between the first reticle MA1 and the second reticle MA2. In such embodiment, the first image field I1 and the second image field I2 may form a substantially continuous image field which can be used to expose a single large target portion on a substrate. In such embodiment the light blocking device may not be required.

The combination of the first reticle MA1 and the second reticle MA2, arranged substantially in the same plane and aligned with respect to each other, provides a reticle assembly which behaves as a single large reticle comprising the first image field I1 and the second image field I2.

The size of each of the first reticle and the second reticle may for example be about 6 inch by 6 inch (152 mm by 152 mm) so that the assembly of the first reticle and the second reticle form a reticle of about 6 by 12 inch (152 mm by 305 mm).

The reticle assembly according to an embodiment of the invention can be used for a more efficient pattern of the scanning movements of the substrate, since in a single scanning movement two subsequent target portion can be exposed by the combination of the first reticle and the second reticle.

The alignment between the first reticle MA1 and the second reticle MA2 is desirably of relative high accuracy. If there is a relative small residual misalignment detected after alignment, the first reticle MA1 and second reticle MA2 may be realigned. As an alternative solution, the positioning device of the substrate table WT may be configured to correct for the residual misalignment during a scanning movement in the actual projection process.

Figure 5:
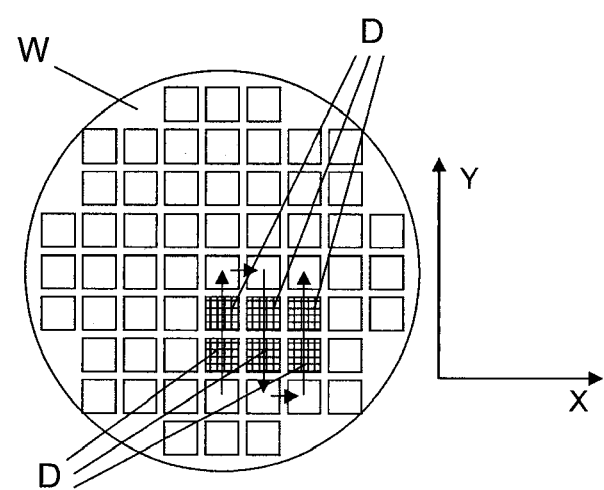
FIG. 5 depicts a possible scanning pattern of a substrate table in a lithographic apparatus with a reticle assembly according to an embodiment of the invention

FIG. 5 shows a more efficient scanning pattern of substrate table scanning movements which can be carried out with a reticle assembly according to an embodiment of the invention.

The substrate W is moved with a substrate table scanning movement indicated by the arrow, with respect to the projection system PS. During this substrate table scanning movement in the positive Y-direction a beam B patterned by the first image field I1 is projected on the first target portion and a beam patterned by the second image field I2 is projected on a second target portion D. Only when exposure of the second target portion D is finished, the substrate table WT is decelerated, moved in the X-direction over the distance of a row of target portions and accelerated up to the scanning speed to perform a second scanning movement in the negative Y-direction to expose again a patterned radiation beam B on a third target portion D and a fourth target portion D. After the exposure of the third and fourth target portions D has been finished, the substrate table WT is again decelerated, moved in the X-direction and accelerated up to the scanning speed to perform a third scanning movement in the positive Y-direction to expose the patterned radiation beam B on a fifth and sixth target portions D. This pattern of movements can be repeated until all a patterned radiation beam B has been exposed on all target portions of the substrate D, where exposure is desired.

During the projection of the patterned radiation beam B on the first and the second target portions D, the reticle support MT is moved with a scanning movement from a start position to an end position. Thus only after the projection of a patterned radiation beam on two target portions, the reticle support MT and the substrate table support WT are required to decelerate, and accelerate to a scanning speed in the opposite direction. Such scanning pattern may substantially increase the throughput of the lithographic apparatus.

Figure 6:
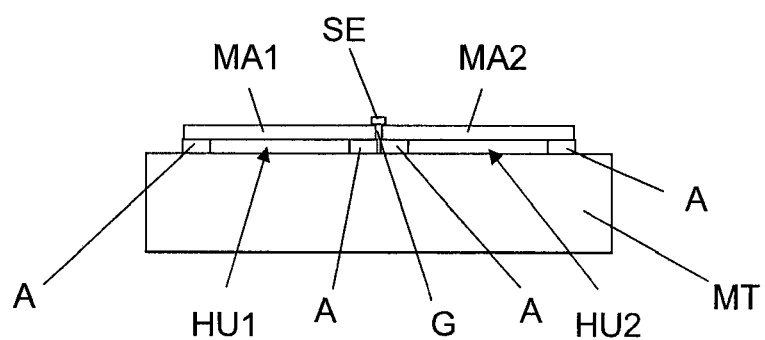
FIG. 6 depicts a side view of a reticle support and reticle assembly according to an embodiment of the invention.
Figure 7:
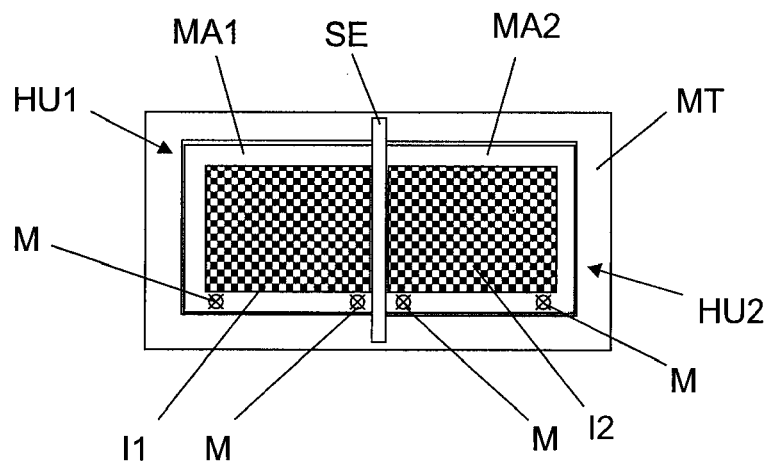
FIG. 7 depicts a top view of the reticle support and reticle assembly of FIG. 6.

FIGS. 6 and 7 show an alternative embodiment of a reticle assembly according to an embodiment of the invention. The reticle support MT comprises a first holder HU1 to hold the first reticle and a second holder HU2 to hold the second reticle. The first holder HU1 and the second holder HU1 are designed to hold the first reticle and second reticle adjacent to each other and in an aligned position. A covering element SE of opaque material is arranged on a gap G between the first reticle MA1 and the second reticle MA2 to prevent that light may pass through the gap G.

In the shown embodiment, the first holder HU1 and the second holder HU2 each comprise a set of actuators A to position the first reticle MA1 and the second reticle MA2 in a desired relative position, e.g. in an embodiment in six degrees of freedom. As an alternative, one or both holders HU1, HU2 hold the respective reticle MA1, MA2 directly. The first reticle MA1 and the second reticle MA2 may be separately loaded in the first holder HU1 and the second holder HU2, respectively.

When the first reticle MA1 and the second reticle MA2 are loaded on the first holder HU1 and the second holder HU2, respectively, the first reticle MA1 and the second reticle MA2 may be aligned with respect to each other. The resulting reticle assembly may be used as described above with respect to the embodiment of FIGS. 4 and 5.

Figure 8:
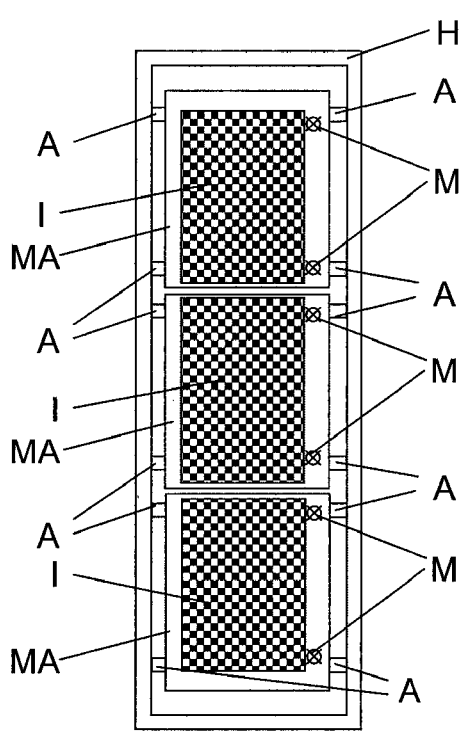
FIG. 8 depicts a reticle assembly according to an embodiment of the invention

FIG. 8 shows a reticle assembly comprising a holder H holding three reticles MA in adjacent and aligned positions. Each reticle MA comprises an image field I and a number of alignment marks M. The holder H comprises actuators A to position and hold the reticles in the aligned positions. As an alternative, the actuators A may be replaced by fixed mounts configured to hold the reticles MA in the aligned position.

With the holder H shown in FIG. 8 three field images I of three reticles MA may be projected on a substrate in a single scanning movement, which may further improve the throughput of the lithographic apparatus.

The actuators A in the holder HU1 and HU2 or in holder H may be of any suitable type, such as piezo, electromagnetic or electrostatic actuators. The holder H may comprise any device capable of holding the respective reticle in a desired position, for example clamps, such as vacuum, magnetic or electrostatic clamps.

Figure 9:
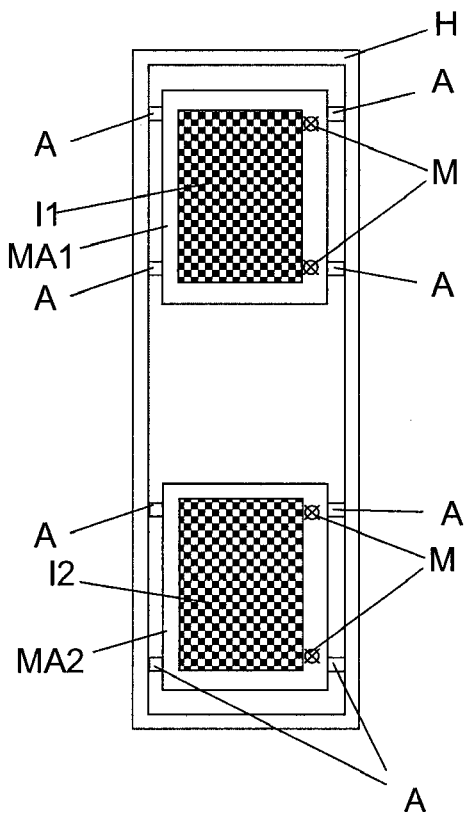
FIG. 9 depicts a reticle assembly according to an embodiment of the invention.

FIG. 9 shows another embodiment of a reticle assembly comprising a holder H holding a first reticle MA1 and a second reticle MA2 in substantially the same plane. The reticles MA1, MA2 are arranged substantially in the same plane and aligned with respect to each other, but arranged at a larger distance with respect to each other than in the embodiments of FIGS. 3, 4, 6, 7, and 8.

The holder H may be configured to be arranged on a single reticle support. In an alternative embodiment, a reticle support may comprise a first and a second holder H to hold the first reticle and second reticle.

Figure 10:
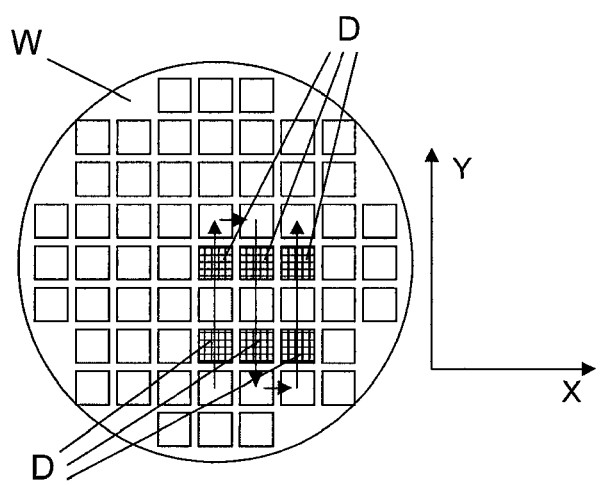
FIG. 10 depicts a possible scanning pattern of a substrate table in a lithographic apparatus with a reticle assembly according to the embodiment of FIG. 9.

The holder H may comprise actuators A to position the first reticle MA1 and the second reticle MA2 in the desired aligned position. In an embodiment, the actuators are arranged to position the first and/or second reticle in six degrees of freedom. As an alternative, the holder H may be provided to hold the first and second reticle The distance between the first image field and the second image field is configured to project during a single scanning movement the first image field on a first target portion and the second image field on a second target portion, whereby a third target portion is arranged between the first target portion and the second target portion. Such scanning pattern is shown in FIG. 10. Any other suitable scanning pattern may also be applied.

Thus, the distance between the first image field I1 and the second image field I2 substantially corresponds to two scribe lanes and an image field in the same direction. Or in other words, the first reticle MA1 and the second reticle MA2 are arranged at a mutual distance such that the distance between the first image field I1 and the second image field I2 divided by the scanning speed of the reticle support corresponds to the distance between two target portions with one target portion therebetween divided by the scanning speed of the substrate table.

In alternative embodiments, the distance between the first image field and the second image field may be two or more image fields and three or more scribe lanes, i.e. a distance corresponding to skipping two or more target portions between a first projected target portion and a second projected target portion. Any other suitable distance between the first and second reticle may also be applied.

To avoid that light passes through the space between the first reticle MA1 and the second reticle MA2 during a single scanning movement, the light may be blocked. For this reason an element of opaque material may be provided to cover the space, or as an alternative the reticle masking device may be closed to block the projection beam. Any other method to block the projection beam may also be applied.

The actuators A in the holders HU1 and HU2 or in the holder H may be of any suitable type, such as piezo, electromagnetic or electrostatic actuators. The holder H may comprise any device capable of holding the respective reticle in a desired position, for example clamps, such as vacuum, magnetic or electrostatic clamps.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising a reticle assembly for use in a lithographic process in which a first image field and a second image field are projected onto a first target portion and a second target portion on a substrate, the reticle assembly being arranged to hold a first reticle having the first image field and a second reticle having the second image field such that a distance between the first and second image fields substantially corresponds to a distance between the first and the second target portions, wherein the reticle assembly comprises a holder configured to hold the first reticle and the second reticle, wherein the holder is configured to have the first and second reticles positionable to abut against each other and the holder comprises a set of actuators configured to position one of the first reticle and the second reticle with respect to the other of the first and second reticle so that the distance between the first and the second image field is adjustable.

2. The lithographic apparatus according to claim 1, wherein the reticle assembly is arranged such that the reticle assembly can be used in a single scanning movement of the lithographic process to project subsequently the first image field and the second image field on the first and second target portions.

3. The lithographic apparatus according to claim 1, wherein the reticle assembly comprises a covering element of opaque material arranged to cover a gap between adjacent edges of the first reticle and the second reticle to avoid that light may pass through the gap.

4. The lithographic apparatus according to claim 3, wherein the covering element is arranged to cover a part of at least one of the first and second reticles between the first and second image fields.

5. The lithographic apparatus according to claim 1, wherein the distance between the first image field and the second image field is smaller than 5 mm.

6. The lithographic apparatus according to claim 1, comprising a reticle support configured to hold the holder, wherein the holder is arranged to be loaded on the reticle support while holding the first and second reticle.

7. The lithographic apparatus according to claim 1, comprising an alignment sensor configured to measure an alignment between the first reticle and the second reticle.

8. The lithographic apparatus according to claim 1, wherein a positioning device of the substrate stage is configured to correct for a misalignment between the first reticle and the second reticle.

9. The lithographic apparatus according to claim 1, wherein the second target portion is adjacent the first target portion so that the distance between the first and second target portions is less than a length of the first or second target portion, the reticle assembly and the substrate movable relative to each other so that, in use, the first target portion of the substrate and the adjacent second target portion of the substrate are exposed while the reticle assembly moves in a first scanning direction and a third target portion of the substrate and an adjacent fourth target portion of the substrate are exposed while the reticle assembly moves in a second scanning direction opposite to the first scanning direction, the second target portion and the third target portion being adjacent in a step direction.

10. A method to project two or more image fields on a first target portion and second target portion on a substrate in a lithographic process, comprising:
    providing a first reticle having the first image field and a second reticle having the second image field;
    placing the first reticle and the second reticle on a same holder of a reticle assembly; and
    providing a distance between the first and second image field corresponding to a distance between the first and second target portions,
    wherein the holder is configured to have the first and second reticles positionable to abut against each other and the holder comprises a set of actuators configured to position one of the first reticle and the second reticle with respect to the other of the first and second reticle so that the distance between the first and the second image field is adjustable.

11. The method according to claim 10, wherein the second target portion is adjacent the first target portion so that the distance between the first and second target portions is less than a length of the first or second target portion, the reticle assembly including the first and second reticles and the substrate movable relative to each other so that, in use, the first target portion of the substrate and the adjacent second target portion of the substrate are exposed while the reticle assembly moves in a first scanning direction and a third target portion of the substrate and an adjacent fourth target portion of the substrate are exposed while the reticle assembly moves in a second scanning direction opposite to the first scanning direction, the second target portion and the third target portion being adjacent in a step direction.

12. The method according to claim 10, wherein a reticle support is configured to hold the holder, wherein the holder is arranged to be loaded on the reticle support while holding the first and second reticle.

\* \* \* \* \*